(12) United States Patent  (10) Patent No.: US 8,405,019 B2
Nishioka  (45) Date of Patent: Mar. 26, 2013

(54) PHOTON DETECTOR

(75) Inventor: Tsuyoshi Nishioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 140 days.

(21) Appl. No.: 13/063,686

(22) PCT Filed: Sep. 12, 2008

(86) PCT No.: PCT/JP2008/066563
§ 371 (c)(1),
(2), (4) Date: May 27, 2011

(87) PCT Pub. No.: WO2010/029638
PCT Pub. Date: Mar. 18, 2010

(65) Prior Publication Data
US 2012/0104239 A1 May 3, 2012

(51) Int. Cl.
*H01J 40/14* (2006.01)
(52) U.S. Cl. ............. 250/214 R; 327/514; 398/189
(58) Field of Classification Search ............. 250/214 A, 250/214 R, 214.1; 327/514; 398/189
See application file for complete search history.

(56) References Cited

U.S. PATENT DOCUMENTS

| 5,441,054 A * | 8/1995 | Tsuchiya | 250/341.1 |
| 5,721,424 A | 2/1998 | Price | |
| 7,705,284 B2 * | 4/2010 | Inoue et al. | 250/214 R |

FOREIGN PATENT DOCUMENTS

| JP | 6 5888 | 1/1994 |
| JP | 2001 507168 | 5/2001 |
| JP | 2003-243691 A | 8/2003 |
| JP | 2005 114712 | 4/2005 |
| JP | 2006 284202 | 10/2006 |
| JP | 2007 94098 | 4/2007 |
| WO | 2007 102430 | 9/2007 |

OTHER PUBLICATIONS

International Search Report issued Dec. 16, 2008 in PCT/JP08/66563 filed Sep. 12, 2008.
Namekata, N. et al. "800 MHz Single-photon detection at 1550-nm using an InGaAs/InP avalanche photodiode operated with a sine wave gating" Optics Express, vol. 14, No. 21, Total 7 pages, (Oct. 16, 2006).
Office Action issued Nov. 13, 2012, in Japanese Patent Application No. 2010-528575 with English translation.

* cited by examiner

*Primary Examiner* — Seung C Sohn
(74) *Attorney, Agent, or Firm* — Oblon, Spivak, McClelland, Maier & Neustadt, L.L.P.

(57) ABSTRACT

Provided is a photon detector that enables an APD response by a sinusoidal wave-shaped gate signal and is operable at an arbitrary drive frequency without requiring a special band removing filter. The photon detector of the present invention includes: a sinusoidal wave generator (3) that generates a sinusoidal wave-shaped gate signal; a beam splitter (7) that splits the gate signal; a bias circuit (5) that supplies a signal resulting from superimposing the gate signal which has passed through the beam splitter (7) on a predetermined DC voltage to an avalanche photodiode; a dummy circuit (6) which inputs the gate signal which has passed through the beam splitter (7), and outputs a response signal simulating the avalanche photodiode; a differential amplifier (10) that amplifies a differential input between a response signal from the avalanche photodiode and the response signal from the dummy circuit (6); and a comparator (11) that outputs a photon detection signal when an output from the differential amplifier (10) is equal to or higher than a predetermined threshold voltage.

5 Claims, 7 Drawing Sheets

PHOTON DETECTOR

TECHNICAL FIELD

The present invention relates to a photon detector required in an information processing field such as optical communication/quantum cryptography.

BACKGROUND ART

A conventional photon detector using a communication wavelength band avalanche photo diode (hereinafter, avalanche photo diode is called "APD") applies a rectangular wave pulse at an incident timing of a photon in a state in which a DC bias slightly lower than a breakdown voltage is applied to the APD, and detects the photon by observing its response waveform (for example, refer to Patent Document 1).

In this detecting system, because the APD functions similarly to a capacitor at the time of detecting no photon, the response waveform from the APD becomes a differentiated waveform of the rectangular wave, and constantly has a positive charge pulse and a negative discharge pulse. At the time of detecting the photon, because an avalanche current flows, a signal pulse is superimposed on the response waveform. In general, the signal pulse that has become larger than the charge pulse is determined by threshold discrimination to enable photon detection.

For that reason, there arises such a problem that the photon detection is not enabled unless the signal pulse becomes larger than the charge pulse, and available APDs have been remarkably limited. On the other hand, there has been also proposed a detecting system in which two APDs are used and the respective response signals are multiplexed in opposite phases to each other to offset the charge pulses (for example, refer to Patent Document 2).

In this detecting system, it is difficult to perfectly offset the mutual charge pulses, and hence there has been proposed a method in which a sinusoidal wave is input to the APD instead of the rectangular wave pulse to eliminate the occurrence of the charge pulse and the discharge pulse. In this case, the response waveform of the APD at the time of detecting no photon is the sinusoidal wave, and at the time of detecting the photon, a signal of a non-sinusoidal wave component is superimposed on the response waveform.

For that reason, there has been proposed a system in which the sinusoidal wave component is removed with the use of a band removing filter to extract a signal component (for example, refer to Non-patent Document 1). Problems with this detecting system reside in that it is difficult to obtain the band removing filter excellent in the characteristic with which the sinusoidal wave components are removed as much as possible and a drive frequency cannot be freely changed because of the frequency dependency of the filter.

Patent Document 1: JP 2005-114712 A
Patent Document 2: JP 2003-243691 A
Non-patent Document 1: N. Namekata, S. Sasamori, and S. Inoue, "800 MHz Single-photon detection at 1550-nm using an InGaAs/InP avalanche photodiode operated with a sine wave gating," Optical Express vol. 14, No. 21, 10043, 2006.

DISCLOSURE OF THE INVENTION

Problems to be Solved by the Invention

In the conventional system in which the sinusoidal wave is input to the APD in the photon detection using the communication wavelength band APD, because a signal is extracted from the response waveform, the sinusoidal wave component that is a non-signal component is removed by the band removing filter. For that reason, there arises such a problem that the drive frequency cannot be freely selected, depending on the band removing filter. Further, in order to efficiently extract the signal components, a band removing filter that is very high in Q-value needs to be prepared.

The present invention has been made to solve the above-mentioned problems, and an object thereof is to provide a photon detector that enables an APD response by a sinusoidal wave-shaped gate signal and is operable at an arbitrary drive frequency without requiring a special band removing filter.

Means for Solving the Problems

A photon detector of the present invention includes: a sinusoidal wave generator that generates a sinusoidal wave-shaped gate signal; a beam splitter that splits the gate signal from the sinusoidal wave generator; a bias circuit that supplies a signal resulting from superimposing one of the gate signals split by the beam splitter on a predetermined DC voltage to an avalanche photodiode that functions as a photon detection element, in synchronism with an input of a photon; a dummy circuit including a capacitor and a resistor, which inputs another of the gate signals split by the beam splitter, and outputs a response signal simulating the avalanche photodiode; a differential amplifier that amplifies a differential input between a response signal from the avalanche photodiode at a time of detecting the photon and the response signal from the dummy circuit; and a comparator that outputs a photon detection signal when an output from the differential amplifier is equal to or higher than a predetermined threshold voltage.

Effects of the Invention

According to the present invention, the response waveforms from the avalanche photo diode at the time of detecting no photon are offset and eliminated. As a result, the photon detection signal components can be extracted with a high S/N ratio, and because the photon detection signal having no frequency dependency of the gate signal is extracted unlike a system using a band removing filter, the drive frequency can be freely changed.

BEST MODES FOR CARRYING OUT THE INVENTION

First Embodiment

Figure 1:
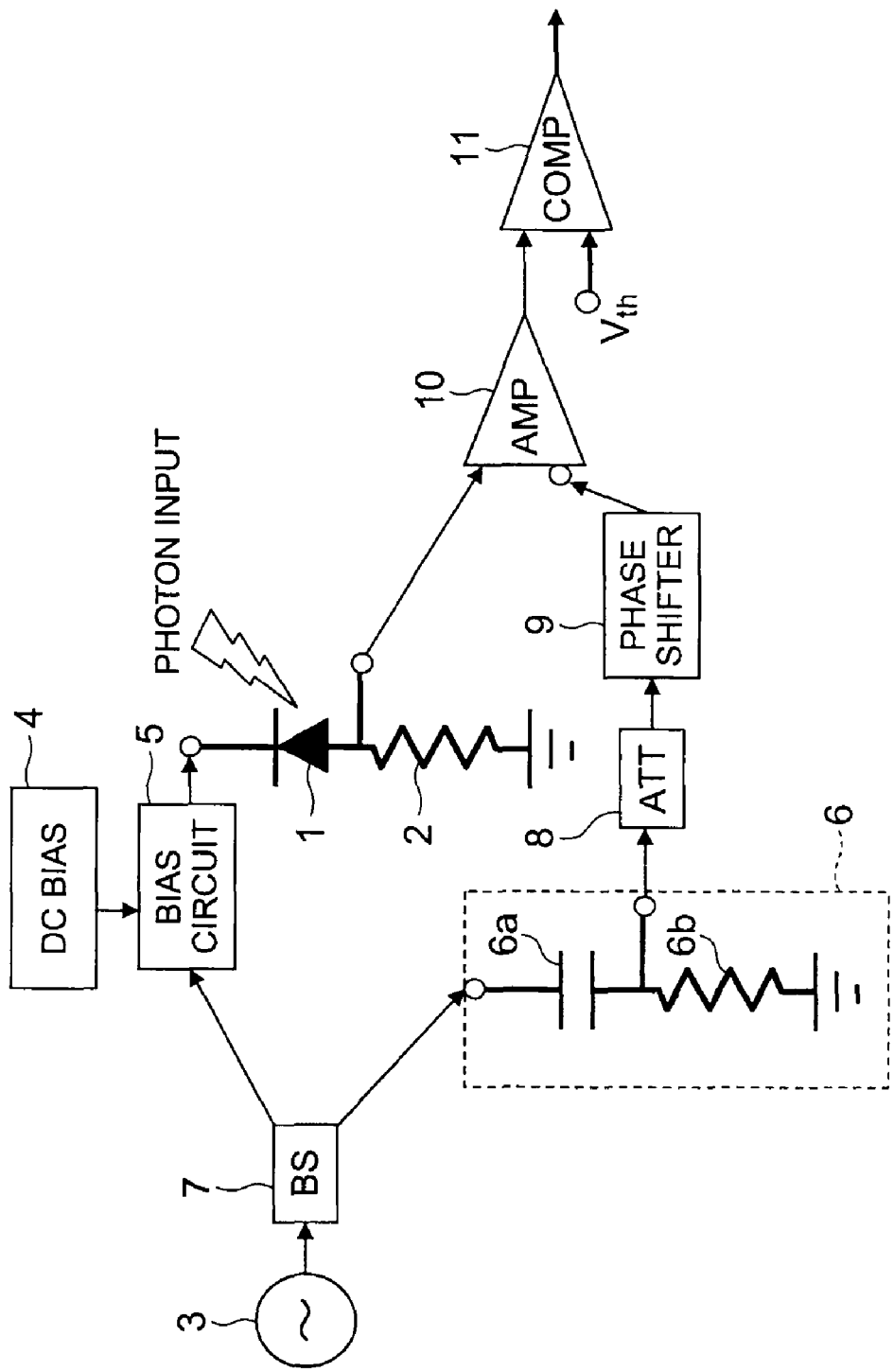
[FIG. 1] A block diagram illustrating a configuration of a photon detector according to a first embodiment of the present invention.

FIG. 1 is a block diagram illustrating a configuration of a photon detector according to a first embodiment of the present invention. The photon detector according to the first embodiment illustrated in FIG. 1 includes an APD 1 which is a photon detection element, a resistor 2 having a resistance of, for example, 50 which is connected to the APD 1, a sinusoidal wave generator 3 for supplying a gate signal to the APD 1, a DC bias 4 for applying a DC voltage to the APD 1, a bias circuit 5 that superimposes the gate signal from the sinusoidal wave generator 3 on the DC voltage from the DC bias 4, and a dummy circuit 6 including a capacitor 6a and a resistor 6b for simulating the APD 1. The photon detector also includes a beam splitter (represented by BS in the FIG. 7 that supplies the gate signal from the sinusoidal wave generator 3 to both of the APD 1 and the dummy circuit 6, an attenuator (represented by ATT in the FIG. 8 that adjusts the amplitude of an output signal from the dummy circuit 6, a phase shifter 9 that adjusts the phase of an output signal from the attenuator 8, and a differential amplifier 10 that differentially amplifies a response signal from the APD 1 and the output signal from the dummy circuit 6 through the attenuator 8 and the phase shifter 9. The photon detector further includes a comparator (represented by COMP in the figure) 11 that compares an output signal from the differential amplifier 10 with a threshold voltage Vth, and outputs a photon detection signal only when the amplitude of the output signal from the differential amplifier 10 is equal to or higher than the threshold voltage Vth.

Figure 2:
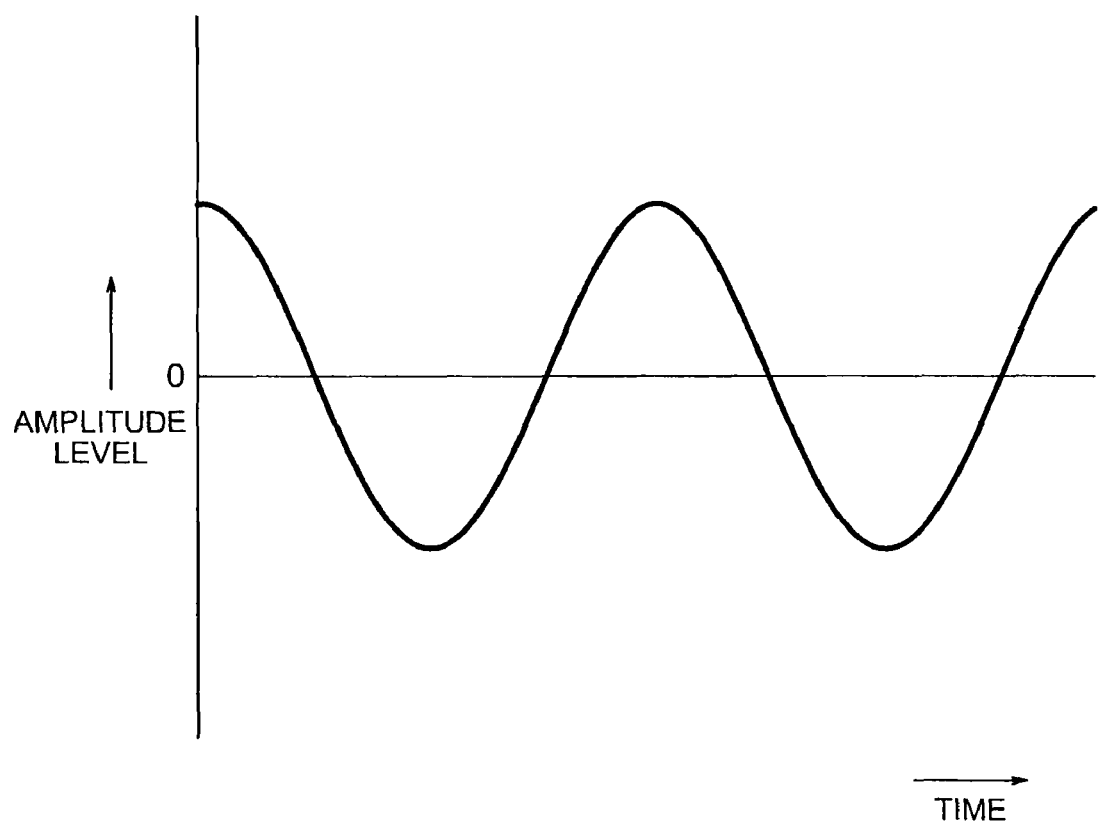
[FIG. 2] A waveform diagram of a sinusoidal wave generated from a sinusoidal wave generator 3 illustrated in FIG. 1.

The operation is described below. Referring to FIG. 1, the APD 1 is an optical device that changes the response waveform according to whether or not a photon of a communication wavelength band (for example, 1,550 nm) is input. In order to induce this reaction, the gate signal needs to be input at an input timing of the photon. The sinusoidal wave generator 3 is a gate signal source for achieving this. As illustrated in FIG. 2, the sinusoidal wave generator 3 is so configured as to adjust the phase of the sinusoidal wave so that an amplitude peak position of the sinusoidal wave is consistent with the input timing of the photon to the APD 1.

Figure 3:
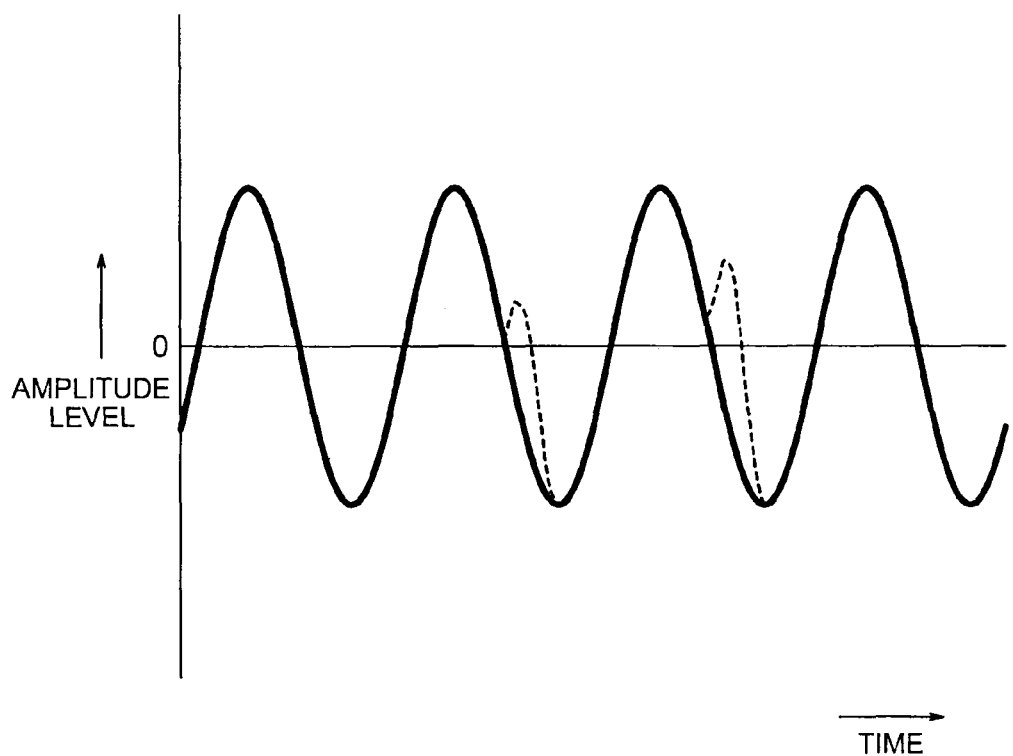
[FIG. 3] A response waveform diagram at the time of detecting a photon and at the time of detecting no photon by an APD 1 illustrated in FIG. 1.

The beam splitter 7 splits a sinusoidal wave signal generated from the sinusoidal wave generator 3 into two signals. In the bias circuit 5, one of the split sinusoidal wave signals is superimposed on the DC voltage generated from the DC bias 4, which is slightly lower than a breakdown voltage of the APD 1, and supplied to the APD 1. The response waveform of the APD 1 when the gate signal is input to the APD 1 is illustrated in FIG. 3. As illustrated in FIG. 3, the APD 1 returns the response waveform of the sinusoidal wave when no photon is detected and no avalanche is generated in the APD 1. However, when the photon is input to the APD 1 to generate avalanche, a detection signal superimposed on the sinusoidal wave, which is indicated by the broken lines, is generated.

The other sinusoidal wave signal that has been split by the beam splitter 7 is supplied to the dummy circuit 6 for the APD 1, which includes the capacitor 6a and the resistor 6b. The dummy circuit 6 is a differential circuit, which simulates the response waveform from the APD 1 when no photon is detected. For example, the capacitor 6a functions with 20 nF, and the resistor 6b functions with 50Ω. The output signal from the dummy circuit 6 is a sinusoidal wave. The amplitude of the sinusoidal wave signal from the dummy circuit 6 is adjusted by the attenuator 8 so as to be made consistent with the amplitude of the sinusoidal wave of the response waveform from the APD 1. Then, the phase of the sinusoidal wave signal from the dummy circuit 6 through the attenuator 8 is adjusted by the phase shifter 9 so as to be made consistent with the phase of the sinusoidal wave of the response waveform from the APD 1.

Figure 4:
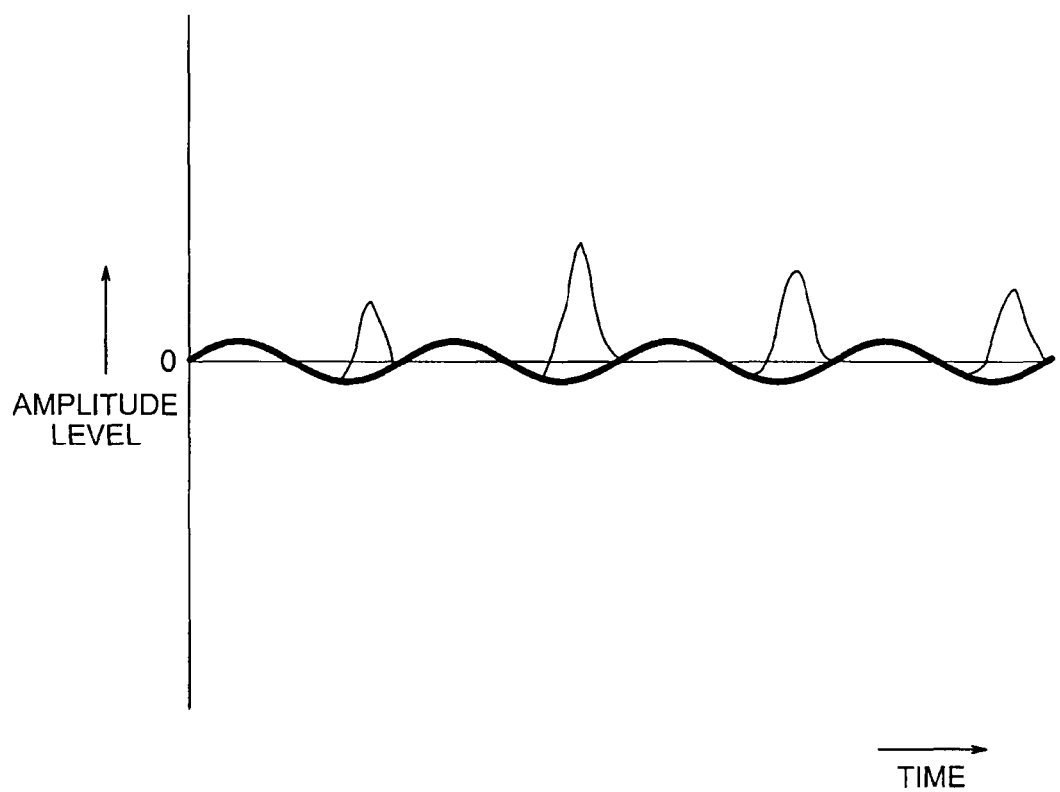
[FIG. 4] A waveform diagram illustrating a photon detection signal from a differential amplifier 10 illustrated in FIG. 1.

The output signal from the APD 1 and the output signal from the dummy circuit 6, which has been adjusted in amplitude and phase, are input to the differential amplifier 10. In this case, the output signal from the dummy circuit 6, which has been adjusted in amplitude and phase, is a phase inverting input. As a result, as the output signal from the differential amplifier 10, as illustrated in FIG. 4, the waveform of the photon detection signal in which only the sinusoidal wave components are offset can be obtained. In this situation, because the photon detection signal by avalanche of the APD 1 can be extracted with a sufficient large amplitude, a signal which is larger in amplitude than the threshold voltage in the comparator 11 is allowed to pass, thereby enabling the photon detection with ease.

As described above, according to the first embodiment, the response waveform at the time of detecting no photon from the APD 1 is simulated by using the dummy circuit 6, and the simulated response waveform is offset by the response waveform from the APD 1 to eliminate the waveform at the time of detecting no photon. As a result, the photon detection signal components can be extracted with a high S/N ratio. Because the detecting system according to the first embodiment extracts the photon detection signal having no frequency dependency of the gate signal unlike the system using the band removing filter, the drive frequency can be freely changed.

Further, in the response waveform of the APD 1 upon inputting the sinusoidal wave gate signal, the high frequency components are not generated unlike the response waveform at the time of inputting the rectangular wave gate signal, and hence the dummy circuit 6 can be easily configured without finely adjusting an electric capacity and a resistance. For that reason, the dummy circuit 6 can be configured by using inexpensive and ordinary general-purpose parts as compared with the band removing filter that is high in Q-value for removing only the sinusoidal wave components.

Further, because this detecting system extracts the photon detection signal by using the dummy circuit 6, the system can be applied not only to the sinusoidal wave gate signal but also to the rectangular wave gate signal.

Second Embodiment

In the above-mentioned first embodiment, the output signal from the dummy circuit 6 is adjusted by only the attenuator 8 and the phase shifter 9, and the response waveform at the time of detecting no photon is offset and eliminated by the differential amplifier 10. On the other hand, in a second embodiment, an example is described in which a high-pass filter is inserted between the differential amplifier 10 and the comparator 11 for a case where the components of a no-photon detection signal could not sufficiently be removed.

Figure 5:
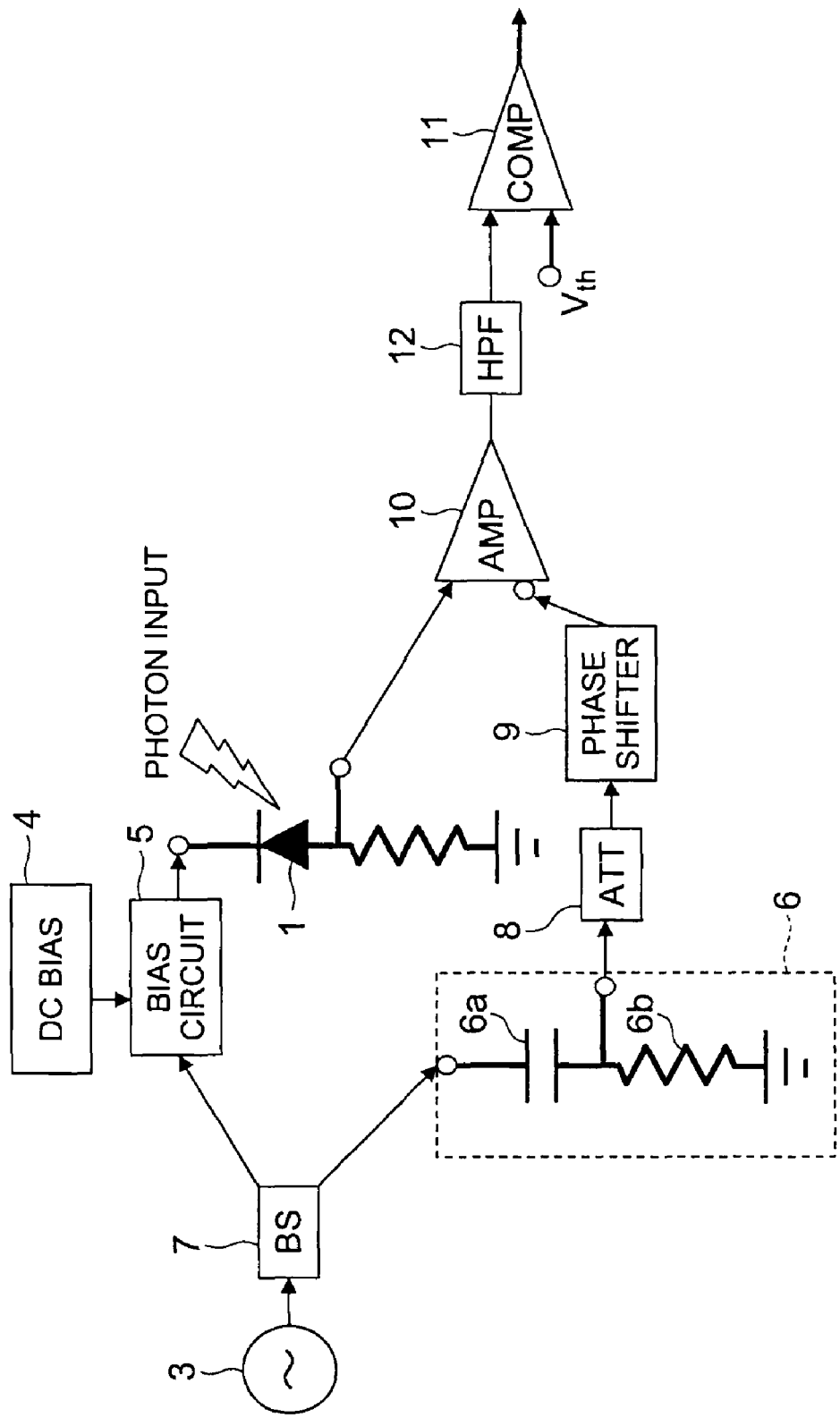
[FIG. 5] A block diagram illustrating a configuration of a photon detector according to a second embodiment of the present invention.

FIG. 5 is a block diagram illustrating a configuration of a photon detector according to the second embodiment of the present invention. In FIG. 5, the same parts as those in the configuration of the photon detector according to the first embodiment illustrated in FIG. 1 are indicated by the same symbols, and their description is omitted. In the photon detector according to the second embodiment illustrated in FIG. 5, as compared with the configuration of FIG. 1, a high-pass filter 12 is inserted between the differential amplifier 10 and the comparator 11.

As illustrated in FIG. 4, when the sinusoidal wave gate signal component remains without being offset and eliminated by the response waveform (bold curve high in frequency) at the time of detecting no photon, the component of the photon detection signal is formed of a high frequency component as compared with the sinusoidal wave gate signal, as indicated by the thin curve low in frequency illustrated in FIG. 4. Therefore, the insertion of the high-pass filter 12 enables the photon detection signal to be extracted with the high S/N ratio. As the high-pass filter 12, for example, a high-pass filter of 300 MHz may be inserted for the sinusoidal wave gate signal of 200 MHz.

As described above, according to the second embodiment, the high-pass filter 12 is inserted between the differential amplifier 10 and the comparator 11 with the result that the photon detection signal can be extractedwith the higher S/Nratio. Further, in adjustment of the output signal from the dummy circuit 6 by the attenuator and the phase shifter 9, for example, the precision can be eased from adjustment of the attenuation by 1 dB to coarse adjustment by 2 dB.

Third Embodiment

In the above-mentioned first and second embodiments, the response waveform at the time of detecting no photon is offset and eliminated by using the output signal from the dummy circuit 6. On the other hand, in the case of the sinusoidal wave gate signal, because the response waveform from the APD 1 at the time of detecting no photon is also a sinusoidal wave, the no-photon detection signal component can be offset and eliminated even if the dummy circuit 6 is not used. In a third embodiment, an example is described in which the dummy circuit 6 is removed from the configuration of the first embodiment.

Figure 6:
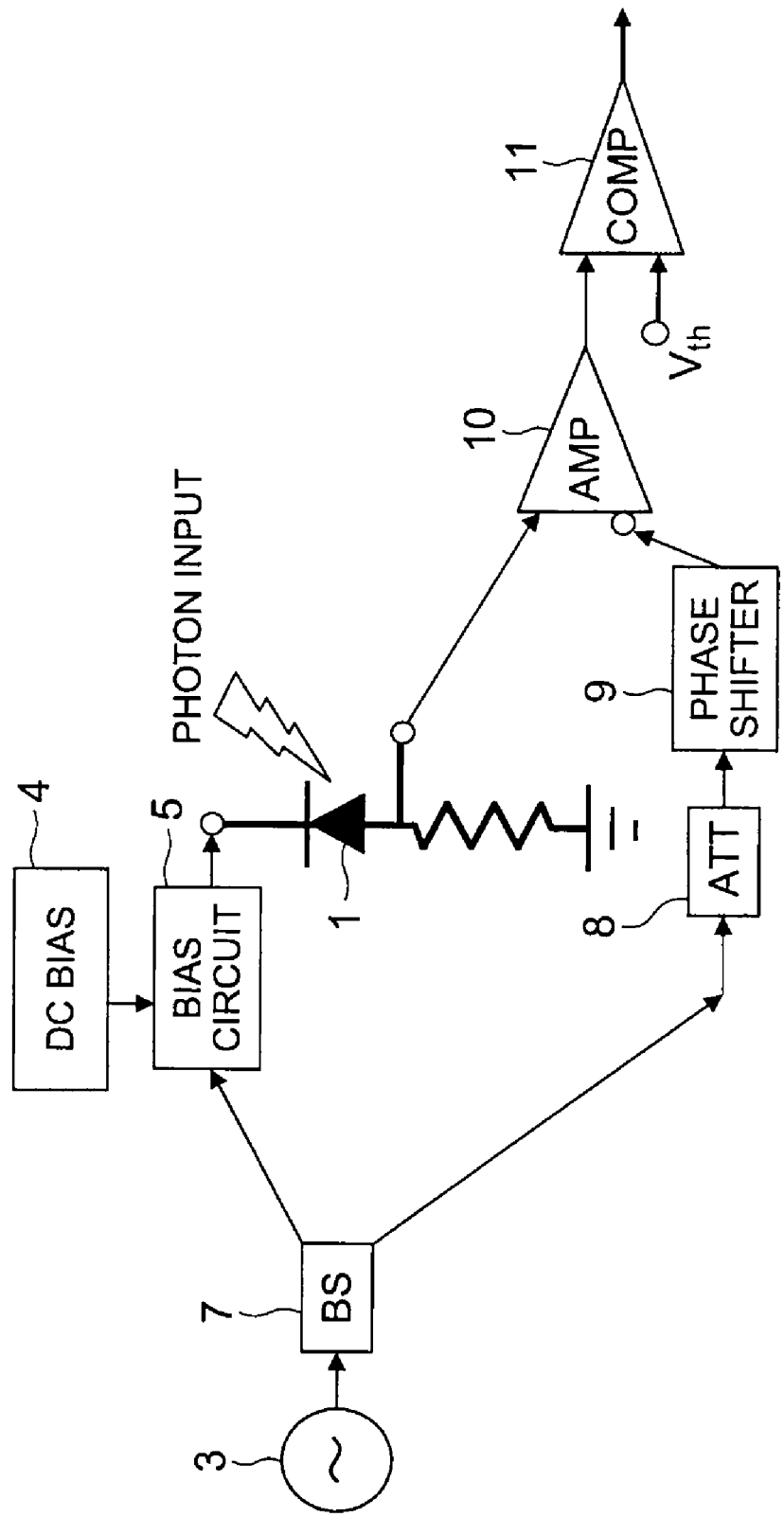
[FIG. 6] A block diagram illustrating a configuration of a photon detector according to a third embodiment of the present invention.

FIG. 6 is a block diagram illustrating a configuration of a photon detector according to the third embodiment of the present invention. In FIG. 6, the same parts as those in the configuration of the photon detector according to the first embodiment illustrated in FIG. 1 are indicated by the same symbols, and their description is omitted. In the photon detector according to the third embodiment illustrated in FIG. 6, the dummy circuit 6 is removed from the configuration of FIG. 1. The photon detector includes the sinusoidal wave generator 3 that generates a sinusoidal wave-shaped gate signal, the beam splitter 7 that splits the gate signal from the sinusoidal wave generator 3, the bias circuit 5 that supplies a signal resulting from superimposing one of the gate signals split by the beam splitter 7 on a predetermined DC voltage, to the APD 1 in synchronism with an input of the photon, and the attenuator 8 that adjusts the amplitude of the other gate signal split by the beam splitter 7. The photon detector also includes the phase shifter 9 that adjusts the phase of an output signal from the attenuator 8, the differential amplifier 10 that amplifies a differential input between the response signal from the APD 1 at the time of detecting the photon and the output signal from the phase shifter 9, and the comparator 11 that outputs the photon detection signal when an output from the differential amplifier 10 is equal to or higher than the predetermined threshold voltage.

The sinusoidal wave that is the response waveform from the APD 1 at the time of detecting no photon and the sinusoidal wave gate signal are homothetic waveforms having the same frequency. Therefore, when the amplitude and the phase are adjusted by using the attenuator 8 and the phase shifter 9, those waveforms can be offset and eliminated by the differential amplifier 10.

As described above, according to the third embodiment, the dummy circuit 6 is removed from the configuration of the first embodiment. As a result, energy flowing into the differential circuit that constitutes the dummy circuit 6 depending on the frequency can be suppressed, and a change depending on the frequency of the amplitude which is effectively applied to the APD 1 of the sinusoidal wave gate signal can be suppressed. For that reason, the stable operation without consumption of a useless energy in the dummy circuit 6 and frequency dependency of the APD 1 can be realized.

Fourth Embodiment

In the above-mentioned first to third embodiments, the sinusoidal wave component that is the response waveform at the time of detecting no photon is offset and eliminated by using another sinusoidal wave component. However, when a high-pass filter that does not allow the sinusoidal wave component to pass therethrough is used, the sinusoidal wave component can be easily removed. In the fourth embodiment, an example is described in which the beam splitter 7, the dummy circuit 6, the attenuator 8, the phase shifter 9, and the differential amplifier 10 are removed from the configuration of the second embodiment illustrated in FIG. 5.

Figure 7:
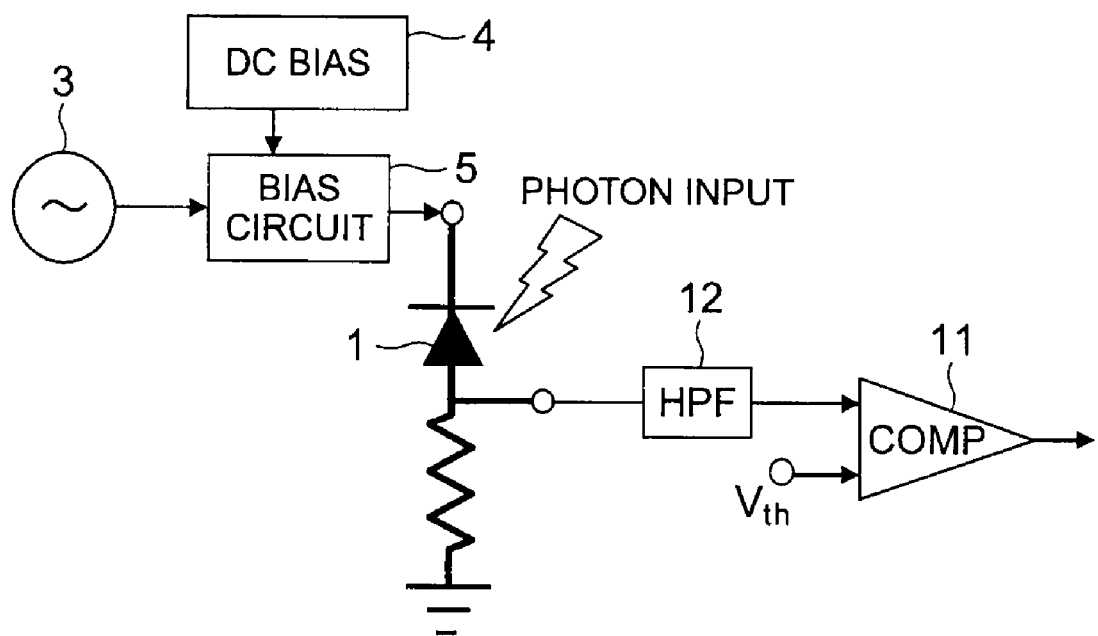
[FIG. 7] A block diagram illustrating a configuration of a photon detector according to a fourth embodiment of the present invention.

FIG. 7 is a block diagram illustrating a configuration of a photon detector according to a fourth embodiment of the present invention. In FIG. 7, the same parts as those in the configuration of the photon detector according to the second embodiment illustrated in FIG. 5 are indicated by the same symbols, and their description is omitted. In the photon detector according to the fourth embodiment illustrated in FIG. 7, the beam splitter 7, the dummy circuit 6, the attenuator 8, the phase shifter 9, and the differential amplifier 10 are removed from the configuration of FIG. 5. The photon detector includes the sinusoidal wave generator 3 that generates the sinusoidal wave-shaped gate signal, the bias circuit 5 that supplies a signal resulting from superimposing the gate signal from the sinusoidal wave generator 3 on the predetermined DC voltage to the APD 1 in synchronism with an input of the photon, the high-pass filter 12 that interrupts a main frequency component of the sinusoidal wave gate signal from the response signal from the APD 1, and the comparator 11 that outputs the photon detection signal when the output from the high-pass filter 12 is equal to or higher than the predetermined threshold voltage.

The signal component from the APD 1 at the time of detecting the photon is a sufficiently high frequency as compared with the sinusoidal wave component that is the response waveform at the time of detecting no photon. Therefore, the photon detection signal can be extracted by only the high-pass filter 12.

As described above, according to the fourth embodiment, when the APD 1 is driven by the sinusoidal wave gate signal, the photon detection signal can be extracted by only the high-pass filter 12. Therefore, a very inexpensive photon detector can be configured by removing the beam splitter 7, the dummy circuit 6, the attenuator 8, the phase shifter 9, and the differential amplifier 10 from the configuration of FIG. 5. Further, the high-pass filter 12 is available as a filter that is steep in the band characteristic and inexpensive as compared with the band removing filter.

The invention claimed is:
1. A photon detector, comprising:
a sinusoidal wave generator that generates a sinusoidal wave-shaped gate signal;
a beam splitter that splits the gate signal from the sinusoidal wave generator;
a bias circuit that supplies a signal resulting from superimposing one of the gate signals split by the beam splitter on a predetermined DC voltage to an avalanche photodiode that functions as a photon detection element, in synchronism with an input of a photon;

a dummy circuit including a capacitor and a resistor, which inputs another of the gate signals split by the beam splitter, and outputs a response signal simulating the avalanche photodiode;

a differential amplifier that amplifies a differential input between a response signal from the avalanche photodiode at a time of detecting the photon and the response signal from the dummy circuit; and a comparator that outputs a photon detection signal when an output from the differential amplifier is equal to or higher than a predetermined threshold voltage.

2. A photon detector according to claim 1, further comprising:

an attenuator that adjusts an amplitude of the response signal from the dummy circuit; and a phase shifter that adjusts a phase of the response signal from the dummy circuit, wherein the differential amplifier amplifies a differential input between the response signal from the avalanche photodiode and the response signal from the dummy circuit, which has been adjusted in amplitude and phase through the attenuator and the phase shifter.

3. A photon detector according to claim 1, further comprising a high-pass filter disposed between the differential amplifier and the comparator, which interrupts a main frequency component of the sinusoidal wave gate signal.

4. A photon detector, comprising:

a sinusoidal wave generator that generates a sinusoidal wave-shaped gate signal;

a beam splitter that splits the gate signal from the sinusoidal wave generator;

a bias circuit that supplies a signal resulting from superimposing one of the gate signals split by the beam splitter on a predetermined DC voltage to an avalanche photodiode that functions as a photon detection element, in synchronism with an input of a photon;

an attenuator that adjusts an amplitude of another of the gate signals split by the beam splitter;

a phase shifter that adjusts a phase of an output signal from the attenuator;

a differential amplifier that amplifies a differential input between a response signal from the avalanche photodiode at a time of detecting the photon and an output signal from the phase shifter; and a comparator that outputs a photon detection signal when an output from the differential amplifier is equal to or higher than a predetermined threshold voltage.

5. A photon detector, comprising:

a sinusoidal wave generator that generates a sinusoidal wave-shaped gate signal;

a bias circuit that supplies a signal resulting from superimposing the gate signal from the sinusoidal wave generator on a predetermined DC voltage to an avalanche photodiode that functions as a photon detection element, in synchronism with an input of a photon;

a high-pass filter that cuts a main frequency component of the sinusoidal wave gate signal from a response signal from the avalanche photodiode; and a comparator that outputs a photon detection signal when an output from the high-pass filter is equal to or higher than a predetermined threshold voltage.

* * * * *